(12) United States Patent
Park et al.

(10) Patent No.: US 10,943,733 B2
(45) Date of Patent: Mar. 9, 2021

(54) CERAMIC DIELECTRIC AND METHOD OF MANUFACTURING THE SAME AND CERAMIC ELECTRONIC COMPONENT AND ELECTRONIC DEVICE

(71) Applicant: SAMSUNG ELECTRONICS CO., LTD., Suwon-si (KR)

(72) Inventors: Hyeon Cheol Park, Hwaseong-si (KR); Chan Kwak, Yongin-si (KR); Kyoung-Seok Moon, Hwaseong-si (KR); Daejin Yang, Yeongju-si (KR); Tae Won Jeong, Yongin-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 16/297,883

(22) Filed: Mar. 11, 2019

(65) Prior Publication Data

US 2019/0279817 A1 Sep. 12, 2019

(30) Foreign Application Priority Data

Mar. 9, 2018 (KR) .......................... 10-2018-0028286
Mar. 4, 2019 (KR) .......................... 10-2019-0024755

(51) Int. Cl.
*C04B 35/628* (2006.01)
*H01G 4/12* (2006.01)
(Continued)

(52) U.S. Cl.
CPC ............ *H01G 4/1218* (2013.01); *C01G 23/00* (2013.01); *C04B 35/4682* (2013.01); *C04B 35/495* (2013.01); *C04B 35/62685* (2013.01); *C04B 35/62802* (2013.01); *C04B 35/62818* (2013.01); *H01C 7/025* (2013.01); *H01F 27/00* (2013.01);
(Continued)

(58) Field of Classification Search
CPC .. H01G 4/1218; H01G 4/30; C04B 35/62802; C04B 35/62685; C04B 35/4682; C04B 2235/5445; C04B 2235/3234; C04B 2235/5454; C01G 23/00; C01G 23/006; H01L 41/43; H01L 41/1871; H01L 41/083; H01C 7/025
See application file for complete search history.

(56) References Cited

U.S. PATENT DOCUMENTS 5,478,610 A 12/1995 Desu et al.
5,527,567 A 6/1996 Desu et al.
(Continued)

FOREIGN PATENT DOCUMENTS

JP 1996-111411 A 4/1996
JP 2010126735 A 6/2010
(Continued)

OTHER PUBLICATIONS

Su et al., "High Energy Density Performance of Polymer Nanocomposites Induced by Designed Formation of BaTiO@Sheet-like TiO Hybrid Nanofillers", The Journal of Physical Chemistry C, 120 (22), 2016, pp. 11769-11776.

*Primary Examiner* — Noah S Wiese
(74) *Attorney, Agent, or Firm* — Cantor Colburn LLP (57) ABSTRACT

A ceramic dielectric including: a bulk dielectric including barium (Ba) and titanium (Ti); a ceramic nanosheet; and a composite dielectric of the bulk dielectric and the ceramic nanosheet.

26 Claims, 8 Drawing Sheets
(2 of 8 Drawing Sheet(s) Filed in Color)

(51) Int. Cl.
*H01G 4/30* (2006.01)
*H01F 27/00* (2006.01)
*C04B 35/468* (2006.01)
*H01L 41/43* (2013.01)
*H01L 41/187* (2006.01)
*H01C 7/02* (2006.01)
*H01G 4/012* (2006.01)
*C04B 35/495* (2006.01)
*C04B 35/626* (2006.01)
*C01G 23/00* (2006.01)

(52) U.S. Cl.
CPC ........... *H01G 4/012* (2013.01); *H01G 4/1236* (2013.01); *H01G 4/1263* (2013.01); *H01G 4/30* (2013.01); *H01L 41/1871* (2013.01); *H01L 41/43* (2013.01); *C04B 2235/3201* (2013.01); *C04B 2235/3208* (2013.01); *C04B 2235/3213* (2013.01); *C04B 2235/3227* (2013.01); *C04B 2235/3234* (2013.01); *C04B 2235/3236* (2013.01); *C04B 2235/3255* (2013.01); *C04B 2235/3265* (2013.01); *C04B 2235/3298* (2013.01); *C04B 2235/3418* (2013.01); *C04B 2235/5292* (2013.01); *C04B 2235/5445* (2013.01); *C04B 2235/5454* (2013.01); *C04B 2235/652* (2013.01); *C04B 2235/663* (2013.01); *C04B 2235/85* (2013.01)

(56) References Cited

U.S. PATENT DOCUMENTS

| | | | |
|---|---|---|---|
| 6,292,355 | B1 | 9/2001 | Kang et al. |
| 6,795,296 | B1* | 9/2004 | Palanduz ............ H01G 4/1227 361/311 |
| 9,231,188 | B2 | 1/2016 | Suzuki et al. |
| 9,543,500 | B2* | 1/2017 | Osada ..................... G11C 11/22 |
| 9,653,289 | B1* | 5/2017 | Balakrishnan ........ H01L 27/088 |
| 2010/0135856 | A1 | 6/2010 | Pyo et al. |
| 2013/0244016 | A1* | 9/2013 | Osada ..................... G11C 11/22 428/216 |
| 2014/0150966 | A1* | 6/2014 | Osada ..................... H01L 28/56 156/273.3 |
| 2015/0344306 | A1* | 12/2015 | Kim ........................ H01B 1/06 428/220 |
| 2017/0162325 | A1* | 6/2017 | Wang ..................... C08L 83/14 |

FOREIGN PATENT DOCUMENTS

| | | |
|---|---|---|
| JP | 2010127928 A | 6/2010 |
| JP | 5974522 B2 | 8/2016 |
| KR | 10-1541021 B1 | 7/2015 |
| KR | 10-1594836 B1 | 2/2016 |

\* cited by examiner

CERAMIC DIELECTRIC AND METHOD OF MANUFACTURING THE SAME AND CERAMIC ELECTRONIC COMPONENT AND ELECTRONIC DEVICE

CROSS-REFERENCE TO RELATED APPLICATION

This application claims priority to and the benefit of Korean Patent Application No. 10-2018-0028286 filed in the Korean Intellectual Property Office on Mar. 9, 2018, and Korean Patent Application No. 10-2019-0024755 filed in the Korean Intellectual Property Office on Mar. 4, 2019, the entire contents of which are incorporated herein by reference.

BACKGROUND

1. Field

A ceramic dielectric and a method of manufacturing the same, and a ceramic electronic component, and an electronic device are disclosed.

2. Description of the Related Art

An electronic component, such as a capacitor, an inductor, a piezoelectric device, a varistor, or a thermistor can each include a ceramic. A multilayer ceramic capacitor (MLCC), which is an example of the capacitor, includes a plurality of capacitors and is formed in, for example, a chip shape, so that it may be mounted in a flexible printed circuit (FPC) of an imaging device such as a liquid crystal display (LCD), various electronic devices such as a computer or a mobile phone, and the like to charge and discharge electricity, and it may be used in a device for coupling, decoupling, or impedance matching, and the like.

Recently, to provide an electronic device with an improved function and reduced size, a ceramic electronic component, such as a multi-layer ceramic capacitor for an electronic device is also desired to be with improved performance and reduced size.

SUMMARY

An embodiment provides a ceramic dielectric having an improved permittivity and improved resistivity simultaneously.

Another embodiment provides a method of manufacturing the ceramic dielectric.

Yet another embodiment provides a ceramic electronic component including the ceramic dielectric.

Still another embodiment provides an electronic device including the ceramic electronic component.

According to an embodiment, a ceramic dielectric includes a bulk dielectric including barium (Ba) and titanium (Ti); a ceramic nanosheet; and a composite dielectric of the bulk dielectric and the ceramic nanosheet.

A phase of the composite dielectric may be different from a phase of the bulk dielectric and a phase of the ceramic nanosheet.

The composite dielectric may include a plurality of phases.

The phase of the ceramic nanosheet may be represented by at least one of Chemical Formulae 1 to 3.

$$X_m[A_{(n-1)}M_nO_{(3n+1)}]$$ Chemical Formula 1

$$X_r[A_pM_{(p-1)}O_{3p}]$$ Chemical Formula 2

$$X_r[M_pO_{(2p+1)}]$$ Chemical Formula 3

In Chemical Formulae 1 to 3, X, A, and M are each independently selected, and

X is at least one of H, an alkali metal, a cation, and a cationic compound,

A is at least one of Ca, Na, Ta, Bi, Ba, and Sr,

M is different from A and at least one of W, Mo, Cr, Ta, Nb, V, Zr, Hf, Pb, Sn, La, and Ti, 0≤m≤2, 0≤r≤2, n≥1, and p≥1.

The phase of the composite dielectric may be represented by Chemical Formula 4.

$$Ba_aTi_bA_cM_dQ_eO_f$$ Chemical Formula 4

In Chemical Formula 4,

A is at least one of Ca, Na, Ta, Bi, Ba, and Sr,

M is different from A and at least one of W, Mo, Cr, Ta, Nb, V, Zr, Hf, Pb, Sn, La, and Ti, Q is at least one of Si, Mn, Al, Fe, Zn, Ga, Dy, and In, 0<a≤4, 0<b≤4, 0≤c≤8, 0<d≤8, 0≤e≤0.5, and 0<f≤30.

The ceramic nanosheet may have an exfoliated structure of a dielectric of an Aurivilius phase, a Ruddlesden-Popper phase, a Dion-Jacobson phase, or a Titano-Niobate phase.

The ceramic nanosheet may include at least one of $Ca_2Nb_3O_{10}$, $Ca_2NaNb_4O_{13}$, $Ca_2Na_2Nb_5O_{16}$, $Sr_2Nb_3O_{10}$, $SrBi_4Ti_4O_{15}$, $Ti_2NbO_7$, and $LaNb_2O_7$.

The ceramic dielectric may include a plurality of semi-conductive grains including the bulk dielectric, and an insulating grain boundary disposed between the adjacent semiconductive grains and including the ceramic nanosheet.

The composite dielectric may be included in at least one of the semiconductive grains and the insulating grain boundary.

The ceramic dielectric may have a higher permittivity and resistivity than the bulk dielectric.

The permittivity of the ceramic dielectric may be twice or more as high as the permittivity of the bulk dielectric.

The ceramic dielectric may satisfy at least one of a permittivity at room temperature of greater than or equal to about 9,000 and a resistivity of greater than or equal to about $1 \times 10^9 \Omega \cdot cm$.

According to another embodiment, a ceramic dielectric includes: a plurality of grains of a ceramic dielectric; and a grain boundary between the adjacent grains of the plurality of grains, wherein at least one of the grains and the grain boundary includes a composite ceramic including at least one of barium (Ba); titanium (Ti); calcium (Ca), sodium (Na), tantalum (Ta), bismuth (Bi), barium (Ba), and strontium (Sr); and at least one of tungsten (W), molybdenum (Mo), chromium (Cr), tantalum (Ta), niobium (Nb), vanadium (V), zirconium (Zr), hafnium (Hf), lead (Pb), tin (Sn), lanthanum (La), and titanium (Ti).

The grains may include a bulk dielectric including barium (Ba) and titanium (Ti).

The grain boundary may include a ceramic nanosheet.

The ceramic nanosheet may include at least one of $Ca_2Nb_3O_{10}$, $Ca_2NaNb_4O_{13}$, $Ca_2Na_2Nb_5O_{16}$, $Sr_2Nb_3O_{10}$, $SrBi_4Ti_4O_{15}$, $Ti_2NbO_7$, and $LaNb_2O_7$.

The composite dielectric may further include at least one of Si, Mn, Al, Fe, Zn, Ga, Dy, and In.

According to another embodiment, a method of manufacturing a ceramic dielectric includes: heat-treating a metal precursor including a barium precursor and a titanium precursor to obtain a bulk dielectric; exfoliating a layered ceramic powder to prepare a ceramic nanosheet; coating the ceramic nanosheet on a surface of the bulk dielectric; and sintering the bulk dielectric coated with the ceramic nanosheet to obtain the ceramic dielectric, the ceramic dielectric including a composite dielectric of the bulk dielectric and the ceramic nanosheet.

The sintering of the bulk dielectric coated with the ceramic nanosheet may include a first heat-treatment at about 1100° C. to about 1400° C., and a second heat-treatment at about 600° C. to about 800° C.

The first heat-treatment may be performed under a strong reduction atmosphere and the second heat-treatment may be performed under a weak oxidizing atmosphere.

The method may further include adding one or more oxides including at least one selected from Si, Mn, Al, Fe, Zn, Ga, Dy, and In, before the sintering of the bulk dielectric coated with the ceramic nanosheet.

The ceramic nanosheet may include at least one of $Ca_2Nb_3O_{10}$, $Ca_2NaNb_4O_{13}$, $Ca_2Na_2Nb_5O_{16}$, $Sr_2Nb_3O_{10}$, $SrBi_4Ti_4O_{15}$, $Ti_2NbO_7$, and $LaNb_2O_7$.

The ceramic nanosheet may be included in an amount of about 1 to 15 parts by weight based on 100 parts by weight of the bulk dielectric.

According to another embodiment, a ceramic electronic component includes a pair of electrodes facing each other and a ceramic dielectric layer disposed between the pair of electrodes, wherein the ceramic dielectric layer includes the ceramic dielectric.

The ceramic electronic component may be a multilayer ceramic capacitor in which a plurality of unit capacitors including the pair of electrodes and the ceramic dielectric layer are laminated.

According to another embodiment, an electronic device includes the ceramic electronic component.

A high permittivity and resistivity of the ceramic electronic component may simultaneously be realized.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above and other advantages and features of this disclosure will become more apparent by describing in further detail exemplary embodiments thereof with reference to the accompanying drawings, in which.

DETAILED DESCRIPTION

Hereinafter, example embodiments of the present disclosure will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers, and/or sections, these elements, components, regions, layers, and/or sections should not be limited by these terms. These terms are only used to distinguish one element, component, region, layer, or section from another element, component, region, layer or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a ceramic dielectric according to an embodiment is described.

A ceramic dielectric according to an embodiment includes a bulk dielectric; a ceramic nanosheet; and a composite dielectric of the bulk dielectric and the ceramic nanosheet.

The bulk dielectric may be, for example, a metal oxide having a three-dimensional structure and may be, for example, a metal oxide having a permittivity of greater than or equal to about 100, e.g., about 100 to about 10,000, or about 150 to about 5000, or about 200 to about 1000. The bulk dielectric may be, for example, a metal oxide including barium (Ba) and titanium (Ti) and may be, for example, $BaTiO_3$ or $Ba_{0.5}Sr_{0.5}TiO_3$, but is not limited thereto. The bulk dielectric may have, for example, a perovskite structure.

The ceramic nanosheet may be, for example, a metal oxide having a two-dimensional structure and may be, for example, an exfoliated structure (nanostructure) obtained from a bulk ceramic powder having a layered structure. The ceramic nanosheet may be for example an insulating metal oxide. For example, the ceramic nanosheet may be an exfoliated structure of a dielectric of an Aurivilius phase, a Ruddlesden-Popper phase, a Dion-Jacobson phase, or Titano-Niobate phase.

For example, the ceramic nanosheet may comprise, for example, a ceramic material having a permittivity of greater than or equal to about 50, e.g., about 50 to about 1000, or about 100 to about 500, or about 150 to about 250, and may be, for example an oxide of at least one selected from Ca, Na, Ta, Bi, Ba, Sr, W, Mo, Cr, Nb, V, Zr, Hf, Pb, Sn, La, and Ti.

For example, the phase of the ceramic nanosheet may be represented by at least one of Chemical Formulae 1 to 3.

$$X_m[A_{(n-1)}M_nO_{(3n+1)}]$$ Chemical Formula 1

$$X_r[A_pM_{(p-1)}O_{3p}]$$ Chemical Formula 2

$$X_r[M_pO_{(2p+1)}]$$ Chemical Formula 3

In Chemical Formulae 1 to 3, X, A, and M are each independently selected, and

X is at least one of H, an alkali metal, a cation, and a cationic compound,

A is at least one of Ca, Na, Ta, Bi, Ba, and Sr,

M is different from A and at least one of W, Mo, Cr, Ta, Nb, V, Zr, Hf, Pb, Sn, La, and Ti, $0 \le m \le 2$, $n \ge 1$, $0 \le r \le 2$, and $p \ge 1$.

For example, the ceramic nanosheet may include at least one of $Ca_2Nb_3O_{10}$, $Ca_2NaNb_4O_{13}$, $Ca_2Na_2Nb_5O_{16}$, $Sr_2Nb_3O_{10}$, $SrBi_4Ti_4O_{16}$, $Ti_2NbO_7$, and $LaNb_2O_7$.

Each ceramic nanosheet may have a thin sheet-shape with a predetermined average lateral dimension. The average lateral dimension, e.g., a width or a length orthogonal to a thickness, of the ceramic nanosheet may be, for example, about 0.1 μm to about 30 μm, about 0.2 μm to about 20 μm, about 0.3 μm to about 15 μm, or about 0.5 μm to about 10 μm. An average thickness of the ceramic nanosheet may be, for example, less than or equal to about 5 nm, less than or equal to about 3 nm, less than or equal to about 2 nm, or less than or equal to about 1.5 nm, e.g., about 0.01 nm to about 5 nm, or about 0.1 nm to about 3 nm. The average lateral dimension and the average thickness of the ceramic nanosheets may be selected according to conditions in the synthesis and exfoliating of the bulk ceramic powder.

The composite dielectric may include a sintered product of the bulk dielectric and the ceramic nanosheet and may include a plurality of phases that are different from the bulk dielectric and the ceramic nanosheet.

For example, the composite dielectric may include a sintered product including barium (Ba), titanium (Ti), and the element included in the dielectric of the ceramic nanosheet and may be, for example, a sintered product including Ba; Ti; and at least one of Ca, Na, Ta, Bi, Ba, Sr, W, Mo, Cr, Nb, V, Zr, Hf, Pb, Sn, La, and Ti.

For example, the phase of the composite dielectric may be selected according to components of the bulk dielectric and the ceramic nanosheet and may be, for example, represented by Chemical Formula 4.

$$Ba_aTi_bA_cM_dQ_eO_f$$ Chemical Formula 4

In Chemical Formula 4,

A is at least one of Ca, Na, Ta, Bi, Ba, and Sr,

M is different from A and at least one of W, Mo, Cr, Ta, Nb, V, Zr, Hf, Pb, Sn, La, and Ti, Q is at least one of Si, Mn, Al, Fe, Zn, Ga, Dy, and In, $0 < a \le 4$, $0 < b \le 4$, $0 \le c \le 8$, $0 < d \le 8$, $0 \le e \le 0.5$ and $0 < f \le 30$.

Figure 1:
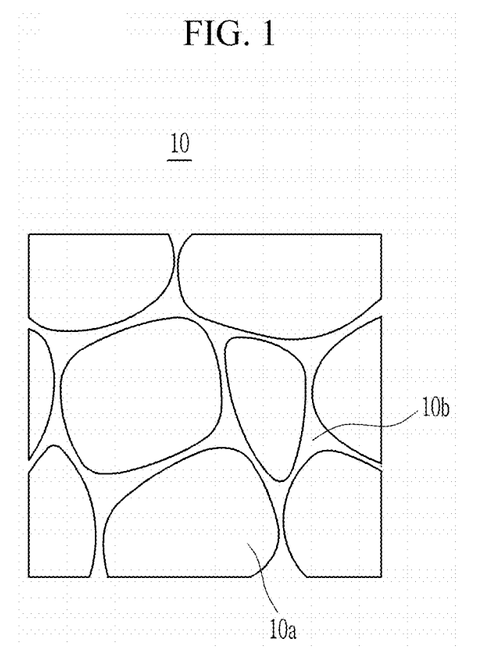
FIG. 1 is a schematic view showing a portion of an embodiment of a ceramic dielectric.

FIG. 1 is a schematic view showing a portion of a ceramic dielectric according to an embodiment.

Referring to FIG. 1, a ceramic dielectric 10 includes a plurality of grains 10a and a grain boundary 10b disposed between adjacent grains 10a.

The grains 10a may include the bulk dielectric having the three-dimensional structure, may include for example a bulk dielectric including barium (Ba) and titanium (Ti), and may include for example $BaTiO_3$ or $Ba_{0.5}Sr_{0.5}TiO_3$, but is not limited thereto. The bulk dielectric in the grains 10a may have an oxygen vacancy in a crystal structure thereof and may have exhibit semiconducting properties, e.g., having a resistivity of about $10^{-6}$ to about $10^7 \Omega \cdot m$.

Grain sizes of the grains 10a may vary within a range of about 0.001 μm to about 10 μm, for example about 0.001 μm to about 8 µm, about 0.01 µm to about 7 µm, about 0.01 µm to about 6 µm, about 0.01 µm to about 5 µm, about 0.01 µm to about 4 µm, or about 0.01 µm to about 3 µm.

An average grain size of the grains 10a may be for example less than or equal to about 2 µm, less than or equal to about 1.8 µm, less than or equal to about 1.7 µm, less than or equal to about 1.5 µm, less than or equal to about 1.4 µm, less than or equal to about 1.3 µm, less than or equal to about 1.2 µm, less than or equal to about 1.1 µm, less than or equal to about 1.0 µm, less than or equal to about 900 nm, less than or equal to about 800 nm, less than or equal to about 700 nm, less than or equal to about 600 nm, less than or equal to about 500 nm, or less than or equal to about 300 nm and for example greater than or equal to about 50 nm, greater than or equal to about 60 nm, greater than or equal to about 70 nm, greater than or equal to about 80 nm, greater than or equal to about 90 nm, or greater than or equal to about 100 nm, but is not limited thereto.

The grain boundary 10b is between the adjacent grains 10a in the ceramic dielectric 10 and for example may have consecutively connected structure. The grain boundary 10b may have a width which is less than a width of the grain 10a, and may have a width within about 20%, for example, within about 15%, or within about 10% of a width of the grain 10a, e.g., about 0.1% to about 20%, or 1% to about 10% of a width of the grain 10a.

The grain boundary 10b may include the ceramic nanosheet, and may include, for example an oxide of at least one of calcium (Ca), sodium (Na), tantalum (Ta), bismuth (Bi), barium (Ba), strontium (Sr), tungsten (W), molybdenum (Mo), chromium (Cr), niobium (Nb), vanadium (V), zirconium (Zr), hafnium (Hf), lead (Pb), tin (Sn), lanthanum (La), and titanium (Ti), and may include, for example, the dielectric represented by one of Chemical Formulae 1 to 3, for example at least one of $Ca_2Nb_3O_{10}$, $Ca_2NaNb_4O_{13}$, $Ca_2Na_2Nb_5O_{16}$, $Sr_2Nb_3O_{10}$, $SrBi_4Ti_4O_{15}$, $Ti_2NbO_7$, and $LaNb_2O_7$. The ceramic nanosheet may fill between adjacent grains 10a. The ceramic nanosheet may be an insulating metal oxide, and thus the grain boundary 10b may be an insulating grain boundary.

At least one of the grains 10a and the grain boundary 10b may include the composite dielectric. The composite dielectric may include a sintered product of the bulk dielectric and the ceramic nanosheet, and may for example include at least one of barium (Ba); titanium (Ti); and calcium (Ca), sodium (Na), tantalum (Ta), bismuth (Bi), barium (Ba), strontium (Sr), tungsten (W), molybdenum (Mo), chromium (Cr), niobium (Nb), vanadium (V), zirconium (Zr), hafnium (Hf), lead (Pb), tin (Sn), lanthanum (La), and titanium (Ti). For example, the composite dielectric may include at least one of barium (Ba); titanium (Ti); calcium (Ca), sodium (Na), tantalum (Ta), bismuth (Bi), barium (Ba), and strontium (Sr); and at least one of tungsten (W), molybdenum (Mo), chromium (Cr), tantalum (Ta), niobium (Nb), vanadium (V), zirconium (Zr), hafnium (Hf), lead (Pb), tin (Sn), lanthanum (La), and titanium (Ti). For example, the composite dielectric may be for example represented by Chemical Formula 4. The composite dielectric may further include, for example, at least one of silicon (Si), manganese (Mn), aluminum (Al), iron (Fe), zinc (Zn), gallium (Ga), dysprosium (Dy), and indium (In).

For example, the composite dielectric may be present in the grains 10a.

For example, the composite dielectric may be present in the grain boundary 10b.

For example, the composite dielectric may be present in the grain 10a and in the grain boundary 10b.

In this way, the ceramic dielectric 10 includes the grain 10a having semiconductor characteristics, and the thin grain boundary 10b having insulating characteristics, between neighboring grains 10a, and thus may provide improved permittivity and resistivity.

For example, the ceramic dielectric 10 may have greater permittivity and resistivity than those of a bulk dielectric included in the grain 10a, for example, a permittivity which is twice that or more as that of the bulk dielectric included in the grains 10a.

For example, the ceramic dielectric 10 may satisfy at least either one of permittivity of greater than or equal to about 9,000 and resistivity of greater than or equal to about $1 \times 10^9 \Omega \cdot cm$ and, for example, simultaneously both the permittivity and resistivity. Within the range, the ceramic dielectric 10 may for example satisfy permittivity of greater than or equal to about 10,000 and/or resistivity of greater than or equal to about $1 \times 10^{10} \Omega \cdot cm$, for example, permittivity of greater than or equal to about 11,000 and/or resistivity of greater than or equal to about $1 \times 10^{11} \Omega \cdot cm$, and for example, permittivity of greater than or equal to about 12,000 and/or resistivity of greater than or equal to about $1 \times 10^{11} \Omega \cdot cm$.

Hereinafter, a method of manufacturing the ceramic dielectric according to an embodiment is described.

A method of manufacturing the ceramic dielectric according to an embodiment includes preparing a bulk dielectric, preparing a ceramic nanosheet, coating a ceramic nanosheet on the surface of the bulk dielectric, and sintering the bulk dielectric coated with the ceramic nanosheet to obtain a composite dielectric of the bulk dielectric and the ceramic nanosheet.

The bulk dielectric may be for example obtained by heat-treating a metal precursor including a barium precursor and a titanium precursor. Herein, the barium precursor may be for example barium oxide, a barium carbonate salt and/or barium hydroxide, for example $BaCO_3$, $BaO$ and/or $Ba(OH)_2$ and the titanium precursor may be for example titanium oxide, titanium carbonate salt, titanium hydroxide or a titanium acetate salt, for example $TiO_2$ and/or $Ti(OH)_4$.

The barium precursor and the titanium precursor may be for example included in a mole ratio of about 0.8:1.2 to about 1.2:0.8, for example, in a mole ratio of about 0.9:1.1 to about 1.1:0.9 within the range, and, for example, in a mole ratio of about 1:1 within the range.

The heat-treatment may be for example performed in the air, for example, at a temperature ranging from about 700° C. to about 1200° C., for example, about 600° C. to about 1000° C., and for example, about 600° C. to about 800° C.

The ceramic nanosheet may be obtained from a layered ceramic material, wherein the layered ceramic material may be obtained by, for example, heat-treating a mixture including a metal oxide and an alkaline metal compound and/or an alkaline-earth metal compound.

The metal oxide may be at least one of, for example, an oxide including Nb, Sr, Bi, Ti, Re, V, Os, Ru, Ta, Ir, W, Ga, Mo, In, Cr, Rh, Mn, Co, and Fe, for example, $Nb_2O_5$ or the like, but is not limited thereto. The alkaline metal compound and/or the alkaline-earth metal oxide may be at least one of, for example, a compound including Ca, and K, for example, $CaCO_3$, $K_2CO_3$, or the like, but is not limited thereto. The mixing ratio of the metal oxide and the alkaline metal compound and/or the alkaline-earth metal compound may be appropriately chosen considering a composition of the ceramic material to be obtained, for example, about 0.1 mol to about 1 mol of the alkaline metal compound and/or the alkaline-earth metal compound may be mixed per about 1 mol of the metal oxide, but is not limited thereto. The heat-treatment may be performed, for example, at about 750° C. to about 1500° C. for about 10 hours to about 50 hours under an air atmosphere, a nitrogen atmosphere, an argon atmosphere, or a vacuum, but is not limited thereto.

The layered ceramic material may be pulverized to obtain a layered ceramic powder. The layered ceramic powder may be exfoliated in the various ways.

For example, the layered ceramic powder is acid-exchanged with an acidic solution such as hydrochloric acid, sulfuric acid to obtain a layered proton-exchanged ceramic powder in which at least one part of the alkaline metal is substituted with proton ($H^+$). A concentration, a treatment temperature, and a treatment time or the like may be appropriately selected, but are not particularly limited.

Subsequently, the obtained layered proton exchange ceramic powder is intercalated to provide an intercalated layered ceramic powder. The intercalation may be performed using, for example, a C1 to C20 alkylammonium salt compound as an intercalant but is not limited thereto. The alkylammonium salt compound may be for example a tetramethylammonium compound such as tetramethylammonium hydroxide, a tetraethyl ammonium compound such as tetraethylammonium hydroxide, a tetrapropyl ammonium compound such as tetrapropylammonium hydroxide, a tetrabutylammonium compound such as tetrabutylammonium hydroxide and/or a benzyl alkylammonium compound such as benzylmethylammonium hydroxide but is not limited thereto.

The alkylammonium salt compound may be provided as an aqueous solution, and the concentration of the alkylammonium salt aqueous solution may be about 0.01 mol % to about 20 mol % based on protons of proton exchange ceramic powder but is not limited thereto. A temperature and a time of the intercalation are not particularly limited, for example, it may be performed at about 25° C. to about 80° C. for about 1 day to about 5 days, but is not limited thereto. The intercalant is inserted between the layers of the layered proton exchange ceramic powder so that it may be easily separated into the ceramic nanosheet. For the effective exfoliation, use of at last one of the centrifuge, and the ultrasonic wave may be further performed.

The ceramic nanosheet separated from the layered ceramic powder may be single-crystal ceramic nanosheet and may be stably dispersed in the solvent to exist in a colloidal form. The solvent may be for example a solvent having a high permittivity, for example water or a polar solvent, and may be for example at least one of water, alcohol, acetonitrile, dimethylsulfoxide, dimethyl formamide, and propylenecarbonate, but is not limited thereto.

The bulk dielectric and the ceramic nanosheet may be mixed to coat the ceramic nanosheet on the surface of the bulk dielectric. Herein, the ceramic nanosheet may be included in a less amount than the bulk dielectric and for example the ceramic nanosheet may be included in an amount of about 0.1 to about 20 parts by weight, for example about 0.5 to about 20 parts by weight, about 1 to about 20 parts by weight, or about 1 to about 15 parts by weight based on 100 parts by weight of the bulk dielectric.

During the mixing of the bulk dielectric and the ceramic nanosheet, a sintering additive (sintering agent) may be further added. The sintering additive may be, for example, an oxide or glass compound including Si, Mn, Al, Fe, Zn, Ga, Dy, and/or In, but is not limited thereto. The sintering additive may be for example $SiO_2$. The sintering additive may be supplied in an amount of about 0.1 mol to about 5 mol, for example about 0.3 mol to about 2 mol, or about 0.1 mol to about 1.5 mol based on 100 mol of the bulk dielectric.

The sintering of the bulk dielectric coated with the ceramic nanosheet may be performed continuously at different atmospheres and/or temperatures and may include, for example, a first heat-treatment in a strong reducing atmosphere and a second heat-treatment in a weak oxidizing atmosphere.

In the strong reducing atmosphere, the first heat-treatment may be for example performed at a high temperature of greater than or equal to about 1000° C. in a dry gas atmosphere and in the weak oxidizing atmosphere, the second heat-treatment may be for example performed at a temperature which is lower than the strong reducing atmosphere in an air and/or wet gas atmosphere. For example, the first heat-treatment in the strong reducing atmosphere may be performed at a high temperature of greater than or equal to about 1000° C. in a dry $H_2$ gas or a dry $N_2/H_2$ mixed gas atmosphere, and the second heat-treatment in the weak oxidizing atmosphere may be performed at a temperature which is lower than the strong reducing atmosphere in an air and/or wet $N_2$ atmosphere. For example, the strong reducing atmosphere may be a 100% dry $H_2$ gas or dry $N_2/H_2$ mixed gas atmosphere in which a $N_2:H_2$ volume ratio is for example about 1:99 to about 99:1, about 10:90 to about 90:10, about 20:80 to about 80:20, about 30:70 to about 70:30, about 40:60 to about 60:40, or about 50:50 and the weak oxidizing atmosphere may be a 100% wet $N_2$ gas or wet $N_2/H_2$ mixed gas atmosphere in which a $N_2:H_2$ volume ratio is for example about 1:99 to about 99:1, about 10:90 to about 90:10, about 20:80 to about 80:20, about 30:70 to about 70:30, about 40:60 to about 60:40, or about 50:50. The first heat-treatment and the second heat-treatment may each independently be performed for about 1 hour to 6 hours, for example, for about 2 hours to 4 hours.

For example, the strong reducing atmosphere may be for example a $N_2/H_2$ mixed gas atmosphere and a temperature of about 1100° C. to about 1400° C. and the weak oxidizing atmosphere may be for example an air and/or wet $N_2$ atmosphere and a temperature of about 600° C. to about 800° C. Within the range, the strong reducing atmosphere may be in a temperature range of about 1200° C. to about 1300° C., and the weak oxidizing atmosphere may be for example in a temperature range of about 650 to about 800° C. The first heat-treatment and the second heat-treatment may be independently performed for about 1 hour to about 6 hours, for example, for about 2 hours to about 4 hours. In the strong reducing atmosphere and the weak oxidizing atmosphere, a temperature and time for the heat-treatment may be variously adjusted depending on desirable permittivity and resistivity.

In this way, by performing the heat-treatment is continuously performed in the weak oxidizing atmosphere after the heat-treatment in the strong reducing atmosphere, a loss of oxygen vacancies in the grains 10a may be prevented or reduced, thereby sufficient oxygen vacancies may be ensured and accordingly, the ceramic dielectric 10 having high permittivity including the semiconductive grains may be obtained.

The obtained ceramic dielectric 10 may include a plurality of grains 10a formed of the bulk dielectric and the grain boundary 10b filled between adjacent grains 10a and formed of the ceramic nanosheet and at least one of the grains 10a and the grain boundary 10b may include the composite dielectric of the bulk dielectric and the ceramic nanosheet.

Hereinafter, a ceramic electronic component according to an embodiment is described.

Figure 2:
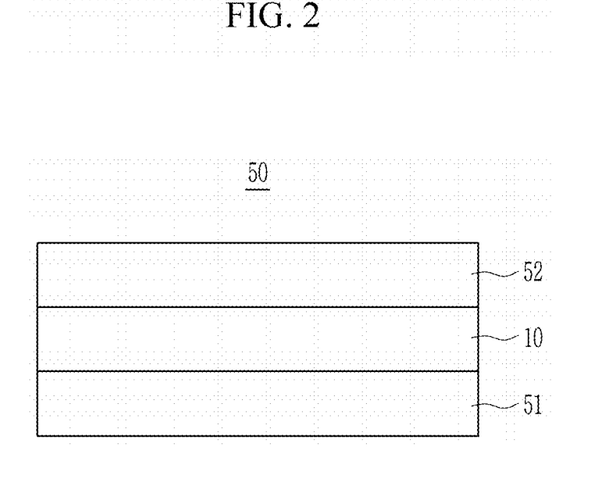
FIG. 2 is a schematic view showing an embodiment of a ceramic electronic component.

FIG. 2 is a schematic view of a ceramic electronic component according to an embodiment.

FIG. 2 shows a capacitor 50 that is an example of the ceramic electronic component.

Referring to FIG. 2, a capacitor 50 according to an embodiment includes a pair of electrodes 51 and 52 facing each other and a ceramic dielectric 10.

The pair of electrodes 51 and 52 include a conductor such as a metal, for example at least one of nickel (Ni), gold (Au), platinum (Pt), palladium (Pd), copper (Cu), silver (Ag), tin (Sn), and an alloy thereof, but are not limited thereto. The pair of electrodes 51 and 52 may be for example a metal plate, a conductive layer disposed on a substrate (not shown), or a metal-plated plate on a substrate (not shown). Herein, the substrate may be for example at last one of a glass substrate, a semiconductor substrate, and a polymer substrate.

The ceramic dielectric 10 is the same as described above.

Figure 3:
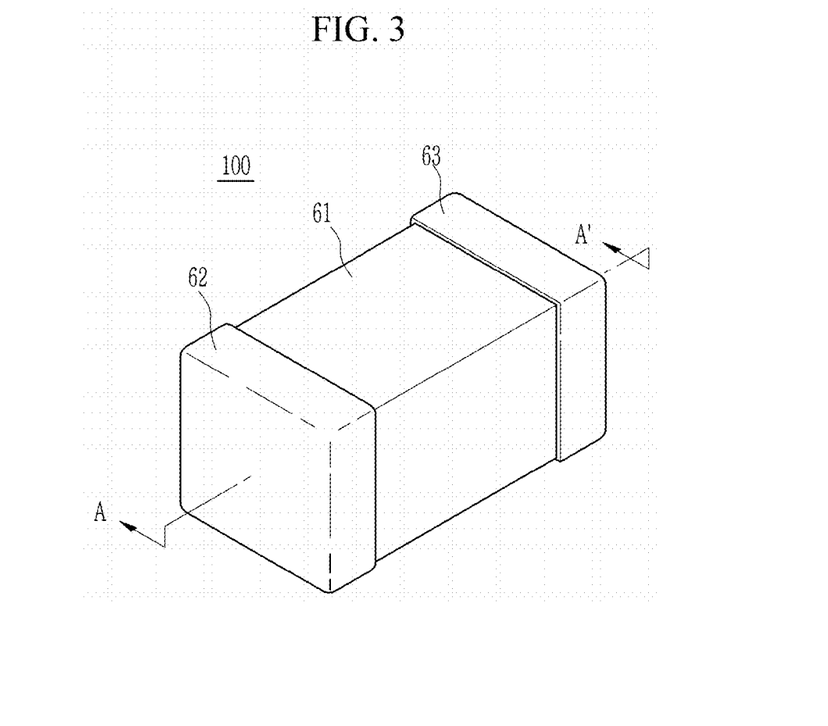
FIG. 3 is a schematic perspective view showing an embodiment of a ceramic electronic component.
Figure 4:
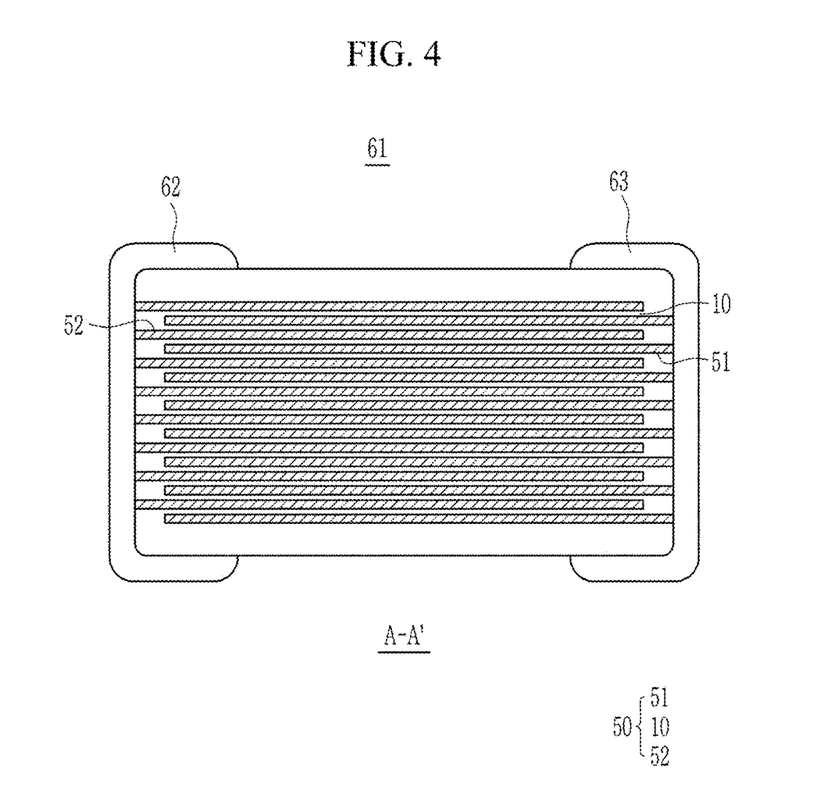
FIG. 4 is a cross-sectional view showing the ceramic electronic component of FIG. 3 taken along the line A-A'.

FIG. 3 is a schematic perspective view of a ceramic electronic component according to another embodiment and FIG. 4 is a cross-sectional view of the ceramic electronic component of FIG. 3 taken along the A-A' direction.

The ceramic electronic component according to the present embodiment is multilayer ceramic capacitor (MLCC) 100 having a laminate structure wherein a plurality of the capacitors of FIG. 2 are laminated as a unit capacitor.

Referring to FIGS. 3 and 4, the multilayer ceramic capacitor 100 includes a capacitor body 61 and external electrodes 62 and 63. The capacitor body 61 may have a laminate structure wherein a plurality of the capacitors 50 of FIG. 4 are laminated, and each of the capacitors includes the electrode (internal electrodes) 51 and 52 and the ceramic dielectric 10 as described above. The details therefor are the same as described above.

As one example of the ceramic electronic component, a capacitor and a multi-layer ceramic capacitor are described above, but the present disclosure is not limited thereto, and it may be applied for all electronic components using ceramic such as a piezoelectric device, a varistor, or a thermistor, etc.

The ceramic electronic component such as the capacitor and the multi-layer ceramic capacitor may be included in a variety of devices, for example, may be employed for an image device such as a liquid crystal display (LCD), a computer, a mobile phone, and the like.

Hereinafter, the embodiments are illustrated in more detail with reference to examples. However, these examples are exemplary, and the present scope is not limited thereto.

EXAMPLES

Synthesis Examples

Synthesis Example 1: Synthesis of Barium Titanium Oxide 1 mole (mol) of $BaCO_3$, 1 mol of $TiO_2$, and 0.0025 mol of dysprosium (Dy) are added to ethanol and then, mixed therewith by using a ball mill for 24 hours. Subsequently, the mixed powder is dried while mixed in a beaker with a magnetic bar and a hot plate. The dried powder is additionally dried in an oven at 80° C. for a day. Subsequently, the dried powder is calcined in the air at 1000° C. for 4 hours to prepare barium titanium oxide.

Synthesis Example 2: Synthesis of Ceramic Nanosheet ($Ca_2Na_2Nb_5O_{16}$)

$K_2CO_3$, $CaCO_3$, $Nb_2O_5$, and NaO are prepared in a mole ratio of 1.1:2:5:2. Subsequently, the powders are added to ethanol and then, mixed therewith by using a ball mill for 24 hours. Then, the mixed powder is dried, while still mixed by using a magnetic bar and a hot plate. The dried powder is additionally sufficiently dried in an oven at 100° C. for 1 day. Subsequently, the obtained powder is calcined at 1200° C. under an air atmosphere for 10 hours to prepare a $KCa_2Na_2Nb_5O_{16}$ mother phase.

Subsequently, the $KCa_2Na_2Nb_5O_{16}$ mother phase is put in a HCl solution or a $HNO_3$ solution, and then, the mixture is stirred and filtered to obtain a $HCa_2Na_2Nb_5O_{16}$ powder. The obtained $HCa_2Na_2Nb_5O_{16}$ powder is added to a tetrabutylammonium hydroxide aqueous solution (TBAOH), and the obtained mixture is stirred and centrifuged to be exfoliated into two-dimensional ceramic nano sheets. Herein, $HCa_2Na_2Nb_5O_{16}$ and TBAOH are mixed in a molar ratio of 1:1. The exfoliation proceeds at room temperature for 7 days at 150 rpm, while the mixture is mechanically shaken.

Subsequently, after removing a precipitate at the bottom of the beaker, the residue thereof is centrifuged for 30 minutes at 2,000 rpm using a centrifuge, a supernatant (2/3) is used, while the rest thereof is discarded. The centrifuged supernatant is dialyzed by using a membrane to remove a tetrabutylammonium hydroxide aqueous solution therefrom and prepare a nanosheet solution including a $Ca_2Na_2Nb_5O_{16}$ ceramic nanosheet.

The $Ca_2Na_2Nb_5O_{16}$ ceramic nanosheet has an average thickness of about 2.5 nm and an average lateral dimension of about 500 nm.

Preparation Examples

Preparation Example 1

100 parts by weight of the barium titanium oxide according to Synthesis Example 1 and 1 part by weight of the $Ca_2Na_2Nb_5O_{16}$ ceramic nanosheet according to Synthesis Example 2 are respectively prepared.

First, the barium titanium oxide according to Synthesis Example 1 is dipped in an aqueous solution of 1 part by weight of polyethyleneimine, a cationic compound and then, surface-treated through ultrasonication. Subsequently, a supernatant is removed therefrom by using a centrifuge. Then, the surface-treated barium titanium oxide is dipped in the $Ca_2Na_2Nb_5O_{16}$ nanosheet solution according to Synthesis Example 2 and then, treated through an ultrasonication to coat the $Ca_2Na_2Nb_5O_{16}$ ceramic nanosheet on the surface of the barium titanium oxide. Subsequently, a supernatant is removed therefrom by using a centrifuge. Then, a ceramic dielectric is prepared by adding 1 mol % of $Mn_2O_3$ and 1 mol % of $SiO_2$ to the barium titanium oxide coated with the $Ca_2Na_2Nb_5O_{16}$ ceramic nanosheet and then, reductive-sintering it under a wet $H_2$ atmosphere at about 1250° C. for 2 hours and reoxidizing it under a wet $N_2$ atmosphere at 700° C. for 2 hours.

Preparation Example 2

A ceramic dielectric is prepared according to the same method as Preparation Example 1 except that the $Ca_2Na_2Nb_5O_{16}$ ceramic nanosheet is used in an amount of 4 parts by weight.

Preparation Example 3

A ceramic dielectric is prepared according to the same method as Preparation Example 1 except that the $Ca_2Na_2Nb_5O_{16}$ ceramic nanosheet is used in an amount of 7 parts by weight.

Preparation Example 4

A ceramic dielectric is prepared according to the same method as Preparation Example 1 except that the $Ca_2Na_2Nb_5O_{16}$ ceramic nanosheet is used in an amount of 15 parts by weight.

Comparative Preparation Example 1

A ceramic dielectric is prepared according to the same method as Preparation Example 1 except that the $Ca_2Na_2Nb_5O_{16}$ ceramic nanosheet is not used.

Evaluation I

A fracture surface of the ceramic dielectric of Preparation Example 1 is examined by using a scanning electron microscope (SEM).

Figure 5:
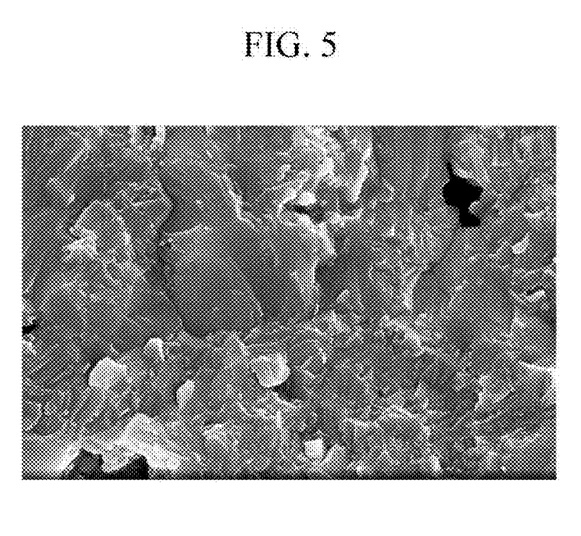
FIG. 5 is an SEM photograph showing a fracture surface of the ceramic dielectric obtained in Preparation Example 1.
Figure 6:
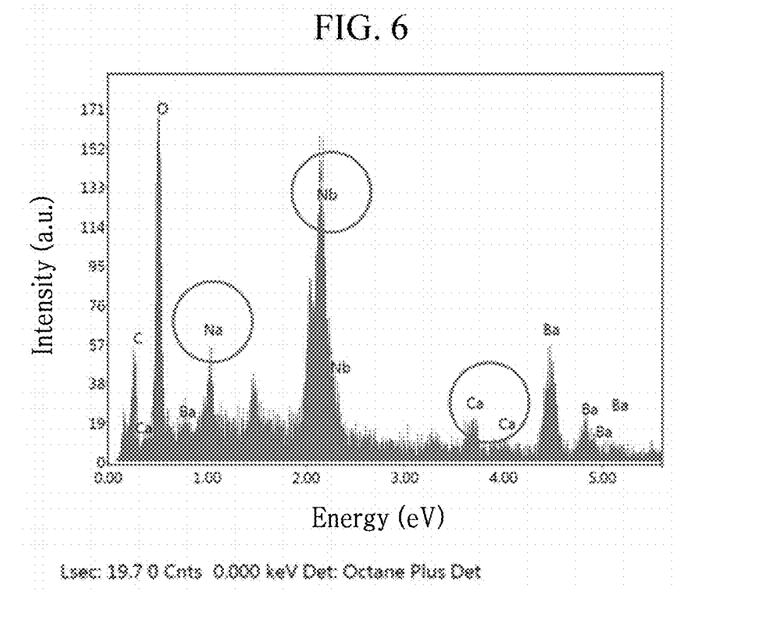
FIG. 6 is a graph of counts (arbitrary units) versus energy (electron volts, eV) showing a result of elemental analysis of the grain portion of the ceramic dielectric obtained in Preparation Example 1.

FIG. 5 is an SEM photograph showing a fracture surface of the ceramic dielectric obtained in Preparation Example 1, and FIG. 6 is a result of elemental analysis of the grain portion of the ceramic dielectric obtained in Preparation Example 1.

Referring to FIG. 5, the ceramic dielectric has a structure having a plurality of grains and a grain boundary disposed among the plurality of grains.

Referring to FIG. 6, calcium (Ca), sodium (Na), and niobium (Nb) in addition to barium (Ba) and titanium (Ti) are found in the grains of the ceramic dielectric, which shows that the composite dielectric of the barium titanium oxide (a bulk dielectric) and the $Ca_2Na_2Nb_5O_{16}$ ceramic nanosheet are present in the ceramic dielectric.

Evaluation II

Figure 7:
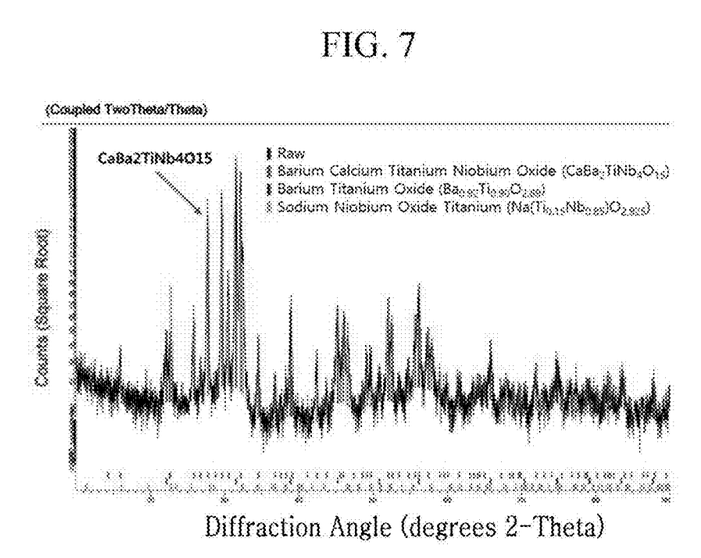
FIG. 7 is a graph of counts (square root) versus diffraction angle (degrees 2-theta) showing the results of an X-ray diffraction (XRD) analysis of the ceramic dielectric obtained in Preparation Example 1, using Cu Kα radiation.

FIG. 7 is an X-ray diffraction (XRD) graph showing the ceramic dielectric obtained in Preparation Example 1.

Referring to FIG. 7, the ceramic dielectric includes a phase represented by $CaBa_2TiNb_4O_{15}$ and a plurality of other novel phases in addition thereto, wherein the novel phases are different from the barium titanium oxide of Synthesis Example 1 and the $Ca_2Na_2Nb_5O_{16}$ ceramic nanosheet of Synthesis Example 2.

Evaluation III

Figure 8:
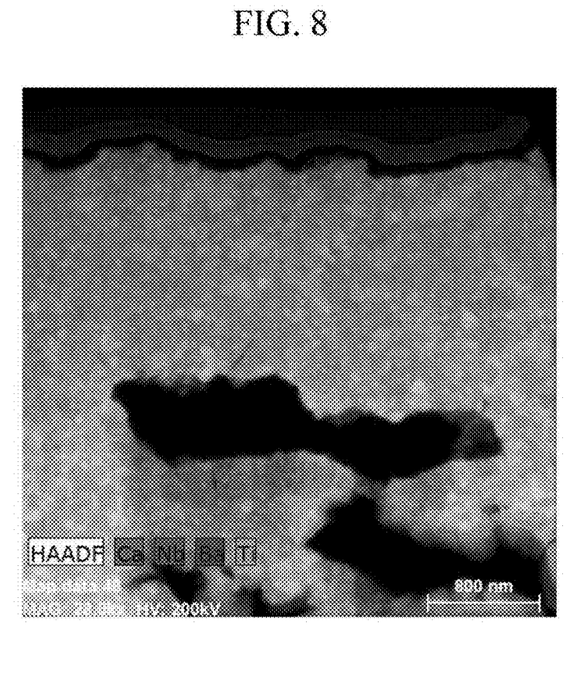
FIG. 8 is a transmission electron microscopic (TEM) photograph of the ceramic dielectric obtained in Preparation Example 1.

FIG. 8 is a transmission electron microscopic (TEM) photograph showing the ceramic dielectric obtained in Preparation Example 1.

Referring to FIG. 8, Ca, Nb, and the like which are components of the $Ca_2Na_2Nb_5O_{16}$ ceramic nanosheet coexist in the barium titanium oxide phase, and accordingly, the ceramic dielectric turn out to include a different novel phase from that of the barium titanium oxide.

EXAMPLES

Example 1

A capacitor is manufactured by coating In—Ga on both surfaces of the ceramic dielectric according to Preparation Example 1 to form an electrode.

Example 2

A capacitor is manufactured by coating In—Ga on both surfaces of the ceramic dielectric according to Preparation Example 2 to form an electrode.

Example 3

A capacitor is manufactured by coating In—Ga on both surfaces of the ceramic dielectric according to Preparation Example 3 to form an electrode.

Example 4

A capacitor is manufactured by coating In—Ga on both surfaces of the ceramic dielectric according to Preparation Example 4 to form an electrode.

Comparative Example 1

A capacitor is manufactured by coating In—Ga on both surfaces of the ceramic dielectric according to Comparative Preparation Example 1 to form an electrode.

Evaluation IV

The permittivity, the dielectric loss, and the resistivity of the capacitors according to Examples 1 to 4 and Comparative Example 1 are evaluated.

The permittivity and the dielectric loss are evaluated by using a 4284A LCR meter, and the resistivity is evaluated by using Keithley 2400.

The results are show in Table 1.

TABLE 1

| | Permittivity (1 kHz) | Dielectric loss (tan δ, %) | Resistivity (Ω · cm) |
|---|---|---|---|
| Example 1 | 11,000 | 7.8 | $1 \times 10^9$ |
| Example 2 | 13,000 | 7.1 | $1 \times 10^{11}$ |
| Example 3 | 18,000 | 6.4 | $3 \times 10^{11}$ |
| Example 4 | 9,000 | 6.8 | $1 \times 10^{10}$ |
| Comparative Example 1 | 6,000 to 7,000 | 5.0 | $1 \times 10^6$ |

Referring to Table 1, the capacitors according to Examples 1 to 4 exhibit permittivity of greater than or equal to 9,000, a dielectric loss of less than or equal to 8%, and resistivity of greater than or equal to $1 \times 10^9 \Omega \cdot cm$ and thus simultaneously satisfy high permittivity and high resistivity.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:
1. A ceramic dielectric, comprising
 a bulk dielectric in the form of a grain with a three-dimensional structure, and comprising barium and titanium;
 a ceramic nanosheet; and
 a composite dielectric of the bulk dielectric and the ceramic nanosheet.
2. The ceramic dielectric of claim 1, wherein a phase of the composite dielectric is different from a phase of the bulk dielectric and a phase of the ceramic nanosheet.

3. The ceramic dielectric of claim 1, wherein the composite dielectric comprises a plurality of phases.

4. The ceramic dielectric of claim 1, wherein a phase of the ceramic nanosheet is represented by at least one of Chemical Formulae 1 to 3:

$$X_m[A_{(n-1)}M_nO_{(3n+1)}], \quad \text{Chemical Formula 1}$$

$$X_r[A_pM_{(p-1)}O_{3p}], \text{ and} \quad \text{Chemical Formula 2}$$

$$X_r[M_pO_{(2p+1)}], \quad \text{Chemical Formula 3}$$

wherein, in Chemical Formulae 1 to 3, X, A, and M are each independently, and

X is at least one of H, an alkali metal, a cation, and a cationic compound,

A is at least one of Ca, Na, Ta, Bi, Ba, and Sr,

M is different from A and at least one of W, Mo, Cr, Ta, Nb, V, Zr, Hf, Pb, Sn, La, and Ti, $0 \le m \le 2$, $0 \le r \le 2$, $n \ge 1$, and $p \ge 1$.

5. The ceramic dielectric of claim 1, wherein the phase of the composite dielectric is represented by Chemical Formula 4:

$$Ba_aTi_bA_cM_dQ_eO_f \quad \text{Chemical Formula 4}$$

wherein, in Chemical Formula 4,

A is at least one of Ca, Na, Ta, Bi, Ba, and Sr,

M is different from A and at least one of W, Mo, Cr, Ta, Nb, V, Zr, Hf, Pb, Sn, La, and Ti, Q is at least one of Si, Mn, Al, Fe, Zn, Ga, Dy, and In, $0<a\le4$, $0<b\le4$, $0\le c\le8$, $0<d\le8$, $0\le e\le0.5$ and $0<f\le30$.

6. The ceramic dielectric of claim 1, wherein the ceramic nanosheet has an exfoliated structure of a dielectric of an Aurivilius phase, a Ruddlesden-Popper phase, a Dion-Jacobson phase, or a Titano-Niobate phase.

7. The ceramic dielectric of claim 1, wherein the ceramic nanosheet comprises at least one of $Ca_2Nb_3O_{10}$, $Ca_2NaNb_4O_{13}$, $Ca_2Na_2Nb_5O_{16}$, $Sr_2Nb_3O_{10}$, $SrBi_4Ti_4O_{15}$, $Ti_2NbO_7$, and $LaNb_2O_7$.

8. The ceramic dielectric of claim 1, wherein the ceramic dielectric comprises
a plurality of semiconductive grains comprising the bulk dielectric, and
an insulating grain boundary disposed between adjacent semiconductive grains of the plurality of semiconductive grains, the insulating grain boundary comprising the ceramic nanosheet.

9. The ceramic dielectric of claim 8, wherein the composite dielectric is included in at least one of the semiconductive grains and the insulating grain boundary.

10. The ceramic dielectric of claim 1, wherein the ceramic dielectric has a permittivity and a resistivity which is greater than a permittivity and a resistivity of the bulk dielectric.

11. The ceramic dielectric of claim 1, wherein a permittivity of the ceramic dielectric is about twice or more of a permittivity of the bulk dielectric.

12. The ceramic dielectric of claim 1, wherein the ceramic dielectric satisfies at least one of a permittivity at room temperature of greater than or equal to about 9,000 and a resistivity of greater than or equal to about $1 \times 10^9 \Omega \cdot cm$.

13. A ceramic dielectric comprising:
a plurality of grains of a ceramic dielectric; and
a grain boundary between adjacent grains of the plurality of grains, wherein the grain boundary comprises a ceramic nanosheet, and at least one of the grains and the grain boundary comprises
a composite ceramic comprising at least one of barium; titanium; calcium, sodium, tantalum, bismuth, and strontium, and
at least one of tungsten, molybdenum, chromium, niobium, vanadium, zirconium, hafnium, lead, tin, and lanthanum.

14. The ceramic dielectric of claim 13, wherein the grains comprise a bulk dielectric comprising barium and titanium.

15. The ceramic dielectric of claim 13, wherein the ceramic nanosheet may be represented by at least one of Chemical Formulae 1 to 3:

$$X_m[A_{(n-1)}M_nO_{(3n+1)}]; \quad \text{Chemical Formula 1}$$

$$X_r[A_pM_{(p-1)}O_{3p}]; \quad \text{Chemical Formula 2}$$

$$X_r[M_pO_{(2p+1)}]; \quad \text{Chemical Formula 3}$$

wherein in Chemical Formulae 1 to 3; X, A, and M are each independently selected and X is at least one of H, an alkali metal, a cation, or a cationic compound, A is at least one of Ca, Na, Ta, Bi, Ba, or Sr, M is different from A and at least one of W, Mo, Cr, Ta, Nb, V, Zr, Hf, Pb, Sn, La, or Ti, and $0 \le m \le 2$, $n \ge 1$, $0 \le r \le 2$, and $p \ge 1$.

16. The ceramic dielectric of claim 13, wherein the ceramic nanosheet comprises at least one of $Ca_2Nb_3O_{10}$, $Ca_2NaNb_4O_{13}$, $Ca_2Na_2Nb_5O_{16}$, $Sr_2Nb_3O_{10}$, $SrBi_4Ti_4O_{15}$, $Ti_2NbO_7$, and $LaNb_2O_7$.

17. The ceramic dielectric of claim 13, wherein the composite dielectric further comprises at least one of silicon, manganese, aluminum, iron, zinc, gallium, dysprosium, or indium.

18. A method of manufacturing a ceramic dielectric, the method comprising:
heat-treating a metal precursor comprising a barium precursor and a titanium precursor to obtain a bulk dielectric;
exfoliating a layered ceramic powder to prepare a ceramic nanosheet;
coating the ceramic nanosheet on a surface of the bulk dielectric; and
sintering the bulk dielectric coated with the ceramic nanosheet to manufacture the ceramic dielectric, the ceramic dielectric comprising a composite dielectric of the bulk dielectric and the ceramic nanosheet.

19. The method of claim 18, wherein the sintering of the bulk dielectric coated with the ceramic nanosheet comprises
a first heat-treatment at about 1100° C. to about 1400° C., and
a second heat-treatment at about 600° C. to about 800° C.

20. The method of claim 19, wherein the first heat-treatment is performed under a reducing atmosphere, and
the second heat-treatment is performed under an oxidizing atmosphere.

21. The method of claim 18, further comprises
adding an oxide comprising at least one selected from Si, Mn, Al, Fe, Zn, Ga, Dy, and In, before the sintering of the bulk dielectric coated with the ceramic nanosheet.

22. The method of claim 18, wherein the ceramic nanosheet comprises at least one of $Ca_2Nb_3O_{10}$, $Ca_2NaNb_4O_{13}$, $Ca_2Na_2Nb_5O_{16}$, $Sr_2Nb_3O_{10}$, $SrBi_4Ti_4O_{15}$, $Ti_2NbO_7$, and $LaNb_2O_7$.

23. The method of claim 18, wherein the ceramic nanosheet is included in an amount of about 1 to about 15 parts by weight, based on 100 parts by weight of the bulk dielectric.

24. A ceramic electronic component, comprising:
a pair of electrodes facing each other; and
a ceramic dielectric layer disposed between the pair of electrodes,
wherein the ceramic dielectric layer comprises the ceramic dielectric of claim 1.

25. The ceramic electronic component of claim 24, wherein the ceramic electronic component is a multilayer ceramic capacitor in which a plurality of unit capacitors comprising the pair of electrodes and the ceramic dielectric layer are laminated.

26. An electronic device comprising the ceramic electronic component of claim 24.

* * * * *